United States Patent [19]

Hashimoto et al.

[11] Patent Number: 5,190,845
[45] Date of Patent: Mar. 2, 1993

[54] PHOTOSENSITIVE RESIN COMPOSITION AND COLOR FILTER COMPRISING A POLYMER DYEABLE WITH AN ANIONIC DYE, AN AZIDE COMPOUND AND A COMPOUND WITH AT LEAST TWO ACRYLOL GROUPS

[75] Inventors: Matsuo Hashimoto, Tano; Nobuyuki Futamura, Maebashi; Sumio Yoda, Takasaki; Yoshifumi Saiki, Maebashi, all of Japan

[73] Assignee: Nippon Kayaku Kabushiki Kaisha, Tokyo, Japan

[21] Appl. No.: 345,543

[22] PCT Filed: Jul. 14, 1988

[86] PCT No.: PCT/JP88/00700

§ 371 Date: May 8, 1989

§ 102(e) Date: May 8, 1989

[87] PCT Pub. No.: WO89/01186

PCT Pub. Date: Feb. 9, 1989

[30] Foreign Application Priority Data

Jul. 28, 1987 [JP] Japan ............................. 62-186561
Oct. 1, 1987 [JP] Japan ............................. 62-245900
Apr. 13, 1988 [JP] Japan ............................. 63-88993

[51] Int. Cl.$^5$ ................... G03F 7/021; G03C 1/695
[52] U.S. Cl. ........................... 430/196; 430/7; 430/145; 430/167; 430/197; 430/28
[58] Field of Search .................. 430/196, 197, 7, 195, 430/288, 281

[56] References Cited

U.S. PATENT DOCUMENTS

| | | | |
|---|---|---|---|
| 3,763,118 | 10/1973 | Ulrich et al. ..................... | 260/78.5 |
| 4,046,577 | 9/1977 | Muzyczko ........................ | 430/197 |
| 4,284,707 | 8/1981 | Nagasawa et al. ............... | 430/196 |
| 4,579,925 | 4/1986 | Ueno et al. ....................... | 526/266 |
| 4,614,701 | 9/1986 | Mori et al. ....................... | 430/197 |
| 4,675,252 | 6/1987 | Hashimoto et al. .............. | 428/431 |
| 4,701,399 | 10/1987 | Nagono et al. ................... | 430/196 |
| 4,820,619 | 4/1989 | Sanada ............................. | 430/197 |
| 4,943,512 | 7/1990 | Kawabata et al. ................ | 430/197 |

FOREIGN PATENT DOCUMENTS

| | | |
|---|---|---|
| 49-41685 | 4/1974 | Japan . |
| 50-108003 | 4/1975 | Japan . |
| 54-161402 | 12/1979 | Japan . |
| 57-117689 | 7/1982 | Japan . |
| 60-221755 | 11/1985 | Japan . |
| 61-210344 | 9/1986 | Japan . |
| 62-115402 | 5/1987 | Japan . |
| 62-127735 | 6/1987 | Japan . |
| 62-138802 | 6/1987 | Japan . |
| 62-149988 | 7/1987 | Japan . |
| 62-194203 | 8/1987 | Japan . |
| 62-209504 | 9/1987 | Japan . |
| 62-275042 | 11/1987 | Japan . |
| 62-283339 | 12/1987 | Japan . |
| 63-10152 | 1/1988 | Japan . |

OTHER PUBLICATIONS

Patent Abstracts of Japan, vol. 9, No. 1.
Patent Abstracts of Japan, vol. 8, No. 86.

*Primary Examiner*—Charles L. Bowers, Jr.
*Assistant Examiner*—John S. Chu
*Attorney, Agent, or Firm*—Nields & Lemack

[57] ABSTRACT

A photosensitive resin composition comprising:
(a) a polymer dyeable with an anionic dye
(b) an azide photosensitive compound, and
(c) a compound having at least two acryloyl and/or methacryloyl groups in the same molecule thereof, and a color filter obtained by using the resin composition.

9 Claims, No Drawings

PHOTOSENSITIVE RESIN COMPOSITION AND COLOR FILTER COMPRISING A POLYMER DYEABLE WITH AN ANIONIC DYE, AN AZIDE COMPOUND AND A COMPOUND WITH AT LEAST TWO ACRYLOL GROUPS

TECHNICAL FIELD

The present invention relates to a photosensitive resin composition for dyeing easily a transparent substrate such as glass with an anionic dye into a desired tone, and to a color filter obtained by using the resin composition.

In recent years, color filters obtained by coloring transparent substrates such as glass have been used in various display devices and the like. Particularly, there has been an increasing demand for filters for color resolution which are obtained by coloring transparent substrates such as glass and are used for liquid-crystal color TV sets or color TV cameras.

The present invention, made for meeting the demand, relates to a photosensitive resin composition for dyeing a transparent substrate such as glass, and to a color filter obtained by using the resin composition.

BACKGROUND ART

In this industrial field, protein-based natural high molecular substances such as casein, gelatin, etc. have hitherto been mainly used. In use of such a material, ammonium or potassium dichromate is added as a photo-curing agent to a liquid obtained by dissolving casein, gelatin or the like in warm water, and the resultant liquid is applied to a glass plate by a spin coating method. Next, irradiation with active rays is conducted through a mask to form a latent image of a dyeable layer on the glass plate, followed by development to develop the dyeable layer. Then, the layer is dyed with a dye. Thus, a natural high molecular substances have been used.

In the case of using casein, gelatin or the like, there are problems that such a natural material is putrescible, the quality thereof is not constant but varies widely depending on the origin thereof, resulting in its extremely poor color reproduction, the material is liable to peel off in hot water, the physical properties of the material are greatly deteriorated by heat, working conditions are restricted, and so on. Further, there are problems in dyeing, that the temperature of a dye bath for dyeing or the like is restricted and, therefore, it is difficult to obtain a deep color.

Moreover, the use of casein, gelatin or the like is accompanied by the use of ammonium or potassium dichromate as the photo curing agent and, therefore, there are problems that it is necessary to solve the pollution problem associated with the working process or disposal of the materials, and chromium contained in the gelatin would not be completely removed but would cause bad effects.

The present inventors have studied synthetic high molecular weight materials in order to solve the above-mentioned problems. First, an attempt was made to dye the surface of a substrate by use of a polymer having a basic group or quaternary ammonium salt group having affinity for anionic dyes. The polymer itself is dyeable because of its affinity for the anionic dyes, but the polymer is soluble in water. Therefore, when the polymer was applied to a glass substrate or the like and dyeing was conducted after drying the applied polymer, the coating peeled off from the surface of the substrate into the dye bath in the dyeing process, and it was impossible to accomplish the purpose of the dyeing or to obtain a dyed substrate. Besides, the present inventors have found out that when a photosensitive resin composition obtained by adding an azide compound to a dyeable polymer as a crosslinking agent is applied to the surface of a substrate such as a glass plate and is irradiated with light, it is possible to form a favorably dyeable resin coating free of peeling. This finding is now being put into practical use. However, with the recent requirements for higher resolution quality, speedup of process, energy saving and the like, there has been a request for a further reduction in the quantity of light used for curing a photosensitive resin composition. In general, when the quantity of light used for curing a photosensitive resin composition is insufficient, the resin film obtained is weak, and a film roughening phenomenon takes place at the time of dyeing of the film, resulting in an opaque dyed film. In such a case, dyeability and resolution are also poor. Furthermore, there arise the problems of poor dimensional stability of images, etc. In order to meet the above-mentioned requirements through increasing the photo-reaction rate of the azide compound in the photosensitive resin composition, the effect of addition of various known sensitizers on the increase of the photo-reaction rate was studied, but none of the sensitizers gave a satisfactory effect.

DISCLOSURE OF THE INVENTION

As a result of the present inventors, further studies for solving the above-mentioned problems, the inventors have found that it is possible to accomplish the purpose by using a photosensitive resin composition (D) comprising
(a) a polymer dyeable with an anionic dye (A),
(b) an azide photosensitive compound (B), and
(c) a compound having at least two acryloyl and/or methacryloyl groups in the same molecule thereof (C), and have completed this invention.

Namely, the photosensitive resin composition (D) used in the invention can be cured, to accomplish the purpose, by a quantity of light which is a fraction of the quantity of light required for curing a resin composition using only the azide photosensitive compound (B). In general, the compound (C), when used singly, requires a quantity of light equal to several times that required for the azide photosensitive compound (B). When the azide photosensitive compound (B) and the compound (C) are used together, it is possible to accomplish the purpose by using a small quantity of light. This is presumed to be due to some favorable interaction between the azide photosensitive compound (B) and the compound (C).

The polymer dyeable with an anionic dye (A) used in this invention preferably comprises a dyeable monomer (a), a hydrophilic monomer (b) and a hydrophobic monomer (c) as constituents. The polymer (A) can be prepared by using a conventional method of polymerization.

As the dyeable monomer (a), there may be mentioned, for example,
(N,N-dimethylamino)ethyl acrylate,
(N,N-dimethylamino)ethyl methacrylate,
(N,N-diethylamino)ethyl acrylate,
(N,N-diethylamino)ethyl methacrylate,
(N,N-dimethylamino)propyl acrylamide, (N,N-dimethylamino)propyl methacrylamide,
(N,N-dimethylamino)ethyl vinyl ether,
(N,N-dimethylamino)propyl acrylate,
(N,N-dimethylamino)propyl methacrylate,
4-vinylpyridine,
2-hydroxy-3-methacryloyloxypropyltrimethylammonium chloride, and
methacryloyloxyethyltrimethylammonium chloride.

As the hydrophilic monomer (b), there may be mentioned, for example,
hydroxyethyl acrylate,
hydroxyethyl methacrylate,
acrylamide, methacrylamide,
vinylpyrrolidone,
dimethylaminoacrylamide, and
methylaminoacrylamide.

As the hydrophobic monomer (c), there may be mentioned, for example,
methyl acrylate, methyl methacrylate,
ethyl acrylate, styrene,
p-methylstyrene, butyl acrylate,
butyl methacrylate,
2-ethylhexyl acrylate, and
2-ethylhexyl methacrylate.

As each of the dyeable monomer (a), the hydrophilic monomer (b) and the hydrophobic monomer (c), at least one monomer each may be used, or two or more monomers each may be used together.

The dyeable monomer (a), the hydrophilic monomer (b) and the hydrophobic monomer (c) are preferably used in respective proportions of 10 to 80% by weight, 2 to 60% by weight, and 5 to 50% by weight. The molecular weight of the polymer (A) thus prepared is preferably 5,000 to 200,000, particularly 10,000 to 100,000.

As the azide photosensitive compound (B) used in this invention, there may be mentioned the following:
4,4'-diazidochalcone,
2,6-bis(4'-azidobenzal)cyclohexanone,
2,6-bis(4'-azidobenzal)- 4-methylcyclohexanone,
1,3-bis(4'-azidobenzal)- 2-propanone,
p-azidobenzalacetophenone,
p-azidobenzalacetone,
1,3-bis(4'-azidobenzal)- 2-propanone-2'-sulfonic acid,
4,4'-diazidostilbene-2,2'-disulfonic acid,
sodium 4,4'-diazidostilbene-2,2'-disulfonate,
1,3-bis(4'-azido-2'-sulfobenzal)-2-propanone,
1,3-bis(4'-azido-2'-sodiumsulfonatobenzal)-2-propanone,
2,6-bis(4'-azido-2'-sulfobenzal)cyclohexanone,
2,6-bis(4'-azido-2'-sulfobenzal)methylcyclohexanone,
2,6-bis(4'-azido-2'-sodiumsulfonatobenzal)methylcyclohexanone, and
N,N'-diethyl-2,2'-disulfonamido-4,4'-diazidostilbene.

As the azide photosensitive compound (B), only one compound may be used, or two or more compounds may be used together.

The amount of the azide photosensitive compound (B) used is preferably 0.1 to 20 parts, particularly 0.5 to 10 parts, per 100 parts of the dyeable polymer (A).

Of such azide photosensitive compounds (B), one having sulfo groups is soluble in water and, therefore, has favorable developability and is capable of being developed at low temperature in a short time.

As the compound (C) used in this invention, there may be mentioned, for example,
spiroglycol diacrylate [3,9-bis(2-acryloyloxy-1,1-dimethyl)- 2,4,8,10-tetraoxaspiro[5,5]undecane],
cyclohexanedimethylol diacrylate,
ethylene glycol diacrylate,
diethylene glycol diacrylate,
triethylene glycol diacrylate,
polyethylene glycol diacrylate,
polypropylene glycol diacrylate,
butylene glycol diacrylate,
neopentyl glycol diacrylate,
1,4-butanediol diacrylate,
1,6-hexanediol diacrylate,
pentaerythritol diacrylate,
pentaerythritol triacrylate,
trimethylolpropane triacrylate,
novolak epoxy acrylate,
bisphenol A epoxy acrylate,
alkylene glycol diepoxy acrylate,
glycidyl ester acrylate,
polyester diacrylate,
bisphenol A diacrylate,
urethane diacrylate,
methylenebisacrylamide,
ethylene glycol dimethacrylate,
diethylene glycol dimethacrylate,
triethylene glycol dimethacrylate,
polyethylene glycol dimethacrylate,
propylene glycol dimethacrylate,
butylene glycol dimethacrylate,
neopentyl glycol dimethacrylate,
1,4-butanediol dimethacrylate,
1,6-hexanediol dimethacrylate, and
trimethylolpropane trimethacrylate.

As the compound (C), only one compound may be used, or two or more compounds may be used together.

The amount of the compound (C) used is preferably 0.1 to 20 parts, particularly 0.5 to 10 parts, per 100 parts of the dyeable polymer (A).

The photosensitive resin composition having the above-mentioned composition is ordinarily used after diluted with an organic solvent or the like. As the organic solvent, there may be mentioned, for example, methyl cellosolve, ethyl cellosolve, toluene, xylene, ethylene glycol monoethyl ether acetate, diethylene glycol dimethyl ether, methyl isobutyl ketone, methyl ethyl ketone, etc. At least one of such solvents may be used either singly or in combination. The proportion of the organic solvent in the dyeable photosensitive resin liquid depends on the composition of the photosensitive resin composition and cannot be specifically prescribed. It is preferable, however, to select the proportion of the organic solvent to obtain such a viscosity that the resin liquid is applicable to the surface of a substrate.

Furthermore, in order to ensure favorable adhesion of the dyeable resin coating to a glass plate, a silane coupling agent is ordinarily added to the photosensitive resin composition. The amount of the silane coupling agent added is preferably 0.1 to 20 parts, particularly 0.5 to 10 parts, per 100 parts of the dyeable polymer (A).

The substrate, such as glass, thus coated with the dyeable resin liquid is ordinarily exposed to rays such as UV rays through a mask. Unexposed portions are then developed by an aqueous solution.

The development is preferably carried out in the range from normal temperature to 60° C. (for instance, 10 to 60° C.). The thickness of the resin coating thus developed can be set to an arbitrary value, for instance, 0.2 to 10 $\mu$. The substrate, such as glass and plastic, having a predetermined pattern thus developed is dyed with an anionic dye.

As the anionic dye, there may be mentioned acid dyes described as "C.I. Acid" in Colour Index (published by the Society of Dyers and Colourists), direct dyes described as "C.I. Direct" in the same, reactive dyes described as "C.I. Reactive" in the same, etc., among which the acid dyes are particularly preferable. As the acid dyes, there may be mentioned C.I. Acid Yellows 17, 49, 67, 72, 127, 110, 135 and 161, C.I. Acid Reds 37, 50, 111, 114, 257, 266 and 317, C.I. Acid Blues 41, 83, 90, 113, 129 182 and 125, C.I. Acid Oranges 7 and 56, C.I. Acid Greens 25 and 41, C.I. Acid Violets 97, 27, 28 and 48, etc.

To perform dyeing by use of the dye, 0.01 to 200 parts by weight of the dye is dissolved in 1000 parts by weight of water. The pH of the liquid thus prepared may be in a weak basic to acidic range. Dyeing by use of the dye solution is carried out at a temperature ranging from room temperature to 100° C. It is preferable to carry out dyeing at a high temperature in the range, because a dyed product is thereby obtainable in a short time. After the dyeing, the dyed product is taken out and dried, whereby the substrate with a dyed surface coating (color filter) is obtainable.

BEST MODE FOR CARRYING OUT THE INVENTION

Example 1

| | |
|---|---|
| Dimethylaminopropylacrylamide | 31 parts |
| 2-Hydroxyethyl methacrylate | 14 parts |
| Vinylpyrrolidone | 15 parts |
| Methyl methacrylate | 15 parts |
| Methyl acrylate | 13 parts |
| Dimethylaminoacrylamide | 10 parts |
| Dioxane | 200 parts |
| $\alpha,\alpha'$-azobis(isobutyronitrile) | 1 part |

A liquid of the above formulation was brought into polymerization reaction in a nitrogen atmosphere at 80° C. for 5 hours. The polymerization liquid was put into a large amount of isopropyl ether, and after precipitation of a polymeric component, the polymer was taken out and dried. A solution comprising a mixture of 15 parts of the dried polymer with 0.63 part of 4,4'-diazidochalcone, 0.57 part of spiroglycol diacrylate, 88 parts of ethyl cellosolve, 27 parts of diethylene glycol dimethyl ether and 0.6 part of a silane coupling agent KBM 603 (a product by Shinetsu Chemical Co., Ltd.) was used as a dyeable photosensitive resin liquid.

Next, the dyeable photosensitive resin liquid was applied to a glass plate by a spin coating method, and after drying at 80° C for 30 minutes, the dried resin coating was irradiated with UV rays at a surface illuminance of 8 mW/cm$^2$ through a mask having a resolution test pattern for 5 seconds. The UV-irradiated resin coating was developed for 5 minutes by immersion in a developing liquid containing 2 parts of Emulgen 913 (a polyoxyethylene nonylphenylene ether type nonionic surface active agent, produced by Kao Soap Co., Ltd.) in 1000 parts of water at 60° C. under stirring, whereby a glass substrate having a dyeable coating in only the irradiated areas was obtained. The glass plate was subjected further to post-baking at 160° C. for 30 minutes, after which the thickness of the coating was 0.5 $\mu$. The glass plate thus treated was dyed by using a 0.2% aqueous solution of Blue 43P (a dye for color filter, produced by Nippon Kayaku Co., Ltd.) at 60° C. for 10 minutes, to obtain a glass plate dyed pattern-wise in deep blue. The resolving power of the pattern of the glass plate was 5 $\mu$, and both the transparency of the dyed coating and the dimensional stability of the image were satisfactory.

Example 2

The same operation as in Example 1 was repeated except that 0.57 part of spiroglycol diacrylate used in Example 1 was replaced by 0.59 part of SU.4100 (a polyacrylate oligomer, produced by Mitsubishi Yuka Fine Chemicals Co., Ltd.). The UV irradiation time required for obtaining the same resolving power, transparency of the dyed coating and dimensional stability of the image as those in Example 1 was 7 seconds.

Example 3

The same operation in Example 1 was carried out except that 0.57 part of spiroglycol diacrylate used in Example 1 was replaced by 0.67 part of cyclohexanedimethylol diacrylate. The UV irradiation time required for obtaining the same resolving power, transparency of the dyed coating and dimensional stability of the image as those in Example 1 was 5 seconds.

Example 4

The same operation in Example 1 was carried out except that 0.63 part of 4,4'-diazidochalcone used in Example 1 was replaced by 0.2 part of 1,3-bis(4'-azidobenzal)-2-propanone and 0.4 part of 4,4'-diazidochalcone. The UV irradiation time required for obtaining the same resolving power, transparency of the dyed coating and dimensional stability of the image as those in Example 1 was 5 seconds.

Example 5

The same operation in Example 1 was carried out except that 0.57 part of spiroglycol diacrylate used in Example 1 was replaced by 0.3 part of ethylene glycol dimethacrylate and 0.3 part of spiroglycol diacrylate. The UV irradiation time required for obtaining the same resolving power, transparency of the dyed coating and dimensional stability of the image as those in Example 1 was 5 seconds.

Example 6

The same operation in Example 1 was carried out except that 0.63 part of 4,4'-diazidochalcone used in Example 1 was replaced by 0.65 part of p-azidobenzalacetophenone. The UV irradiation time required for obtaining the same resolving power, transparency of the dyed coating and dimensional stability of the image as those in Example 1 was 5 seconds.

Comparative Example 1

The same operation as in Example 1 was carried out except that 0.57 part of spiroglycol diacrylate used in Example 1 was not added. The UV irradiation time required for obtaining the same resolving power, transparency of the dyed coating and dimensional stability of the image as those in Example 1 was 40 seconds.

Comparative Example 2

The same operation as in Example 4 was carried out except that 0.57 part of spiroglycol diacrylate used in Example 4 was not added. The UV irradiation time required for obtaining the same resolving power, transparency of the dyed coating and dimensional stability of the image as those in Example 4 was 35 seconds.

Comparative Example 3

The same operation as in Example 6 was carried out except that 0.57 part of spiroglycol diacrylate used in Example 6 was not added. The UV irradiation time required for obtaining the same resolving power, transparency of the dyed coating and dimensional stability of the image as those in Example 1 was 43 seconds.

Example 7

The same operation as in Example 1 was carried out except that 0.63 part of 4,4'-diazidochalcone used in Example 1 was replaced by 0.68 part of sodium 4,4'-diazidostilbene-2,2-disulfonate, 0.57 part of spiroglycol diacrylate used in Example 1 was replaced by 0.67 part of cyclohexanedimethylol diacrylate, and that the 5-minute development in the stirred developing liquid at 60° C carried out in Example 1 was replaced by 1-minute development in the stirred developing liquid at 25° C. The UV irradiation time required for obtaining the same resolving power, transparency of the dyed coating and dimensional stability of the image as those in Example 1 was 5 seconds.

Example 8

The same operation as in Example 1 was carried out except that 0.63 part of 4,4'-diazidochalcone used in Example 1 was replaced by 0.67 part of 1,3-bis(4'-azidobenzal)-2-propanone-2'-sulfonic acid, 0.57 part of spiroglycol diacrylate used in Example 1 was replaced by 0.67 part of cyclohexanedimethylol diacrylate, and that the 5-minute development in the stirred developing liquid at 60° C. carried out in Example 1 was replaced by 2-minute development in the stirred developing liquid at 25° C. The UV irradiation time required for obtaining the same resolving power, transparency of the dyed coating and dimensional stability of the image as those in Example 1 was 20 seconds.

Comparative Example 4

The same operation as in Example 7 was carried out except that 0.67 part of cyclohexanedimethylol diacrylate used in Example 7 was not added. Image formation was unsatisfactory even with UV irradiation for 30 seconds, and a satisfactory result was not obtained.

Comparative Example 5

The same operation as in Example 8 was carried out except that 0.67 part of cyclohexanedimethylol diacrylate used in Example 8 was not added. Image formation was unsatisfactory even with UV irradiation for 60 seconds, and a satisfactory result was not obtained.

Example 9

The same operation as in Example 1 was carried out except that 0.63 part of 4,4'-diazidochalcone used in Example 1 was replaced by 0.15 part of sodium 4,4'-diazidostilbene-2,2'-disulfonate and 0.48 part of 4,4'-diazidochalcone, that 0.57 part of spiroglycol diacrylate used in Example 1 was replaced by 0.67 part of cyclohexanedimethylol diacrylate, and that the 5-minute development in the stirred developing liquid at 60° C. carried out in Example 1 was replaced by 5-minute development in the stirred developing liquid at 40° C. The UV irradiation time required for obtaining the same resolving power, transparency of the dyed coating and dimensional stability of the image as those in Example 1 was 8 seconds.

Comparative Example 6

The same operation as in Example 9 was carried out except that 0.67 part of cyclohexanedimethylol diacrylate used in Example 9 was not added. The UV irradiation time required for obtaining the same results as in Example 9 was 50 seconds.

Examples 10 to 12

|  | Example | | |
|---|---|---|---|
|  | 10 | 11 | 12 |
| Dimethylaminopropyl acrylamide | 30 parts | 28 parts | 31 parts |
| 2-Hydroxyethyl methacrylate | 18 parts | 19 parts | 17 parts |
| Methyl methacrylate | 33 parts | 15 parts | 15 parts |
| Methyl acrylate | 0 part | 20 parts | 19 parts |
| Vinylpyrrolidone | 15 parts | 0 part | 21 parts |
| Dimethylaminoacrylamide | 10 parts | 20 parts | 0 part |
| Dioxane | 210 parts | 218 parts | 220 parts |
| α,α'-azobis (isobutyronitrile) | 2 parts | 1.9 parts | 2.3 part |
| Total | 318 parts | 321.8 parts | 325.3 parts |

Liquids of the above formulations were subjected to polymerization and the polymer obtained was dried by the same operation as in Example 1. Dyeable photosensitive resin liquids were prepared in the same manner as in Example 1 except for using the respective polymers thus obtained, and the resin liquids were processed in the same manner as in Example 1. The UV irradiation times required for obtaining the same resolving power, transparency of the dyed coating and dimensional stability of the image as those in Example 1 were equal to that in Example 1.

Comparative Examples 7 to 9

The same operations as in Examples 10 to 12 were repeated except that 0.57 part of spiroglycol diacrylate used in Examples 10 to 12 was not added. The UV irradiation times required for obtaining the same resolving power, transparency of the dyed coating and dimensional stability of the image as those in Examples 10 to 12 were 35 seconds.

INDUSTRIAL APPLICABILITY

This invention solves the problems of putrescibility of natural materials and wide variations in the product quality depending on the origin of the raw materials, associated with the conventional photosensitive resins obtained by use of natural matter such as gelatine, casein, etc. and a dichromate. Besides, the invention is free of the hexavalent chromium pollution problem arising from a waste liquid.

Furthermore, the dyeable photosensitive resin composition (D) according to this invention ensures curing of the resin by a quantity of light which is a fraction of the quantity of light required for curing a resin composition not using the compound (C). Thus, the invention contributes to energy saving, rationalization of process and a reduction of cost.

We claim:

1. A photosensitive resin composition comprising
   (a) a polymer dyeable with an anionic dye,
   (b) an azide photosensitive compound, and
   (c) a compound having at least two acryloyl groups in the same molecule thereof, selected from the group consisting of spiroglycol diacrylate and cyclohexanedimethylol diacrylate.

2. A resin composition according to claim 1, wherein 0.1 to 20 arts of the azide photosensitive compound and 0.1 to 20 parts of the compound having at least two acryloyl groups int eh same molecule thereof are used per 100 parts of the polymer dyeable with an anionic dye.

3. A resin composition according to claim 1 or 2, wherein the azide photosensitive compound is at least one compound selected from the group consisting of
4,4'-diazidochalcone,
2,6-bis(4'-azidobenzal)cyclohexanone,
2,6-bis(4'-azidobenzal)- 4-methylcyclohexanone,
1,3-bis(4'-azidobenzal)- 2-propanone,
p-azidobenzalacetophenone,
p-azidobenzalacetone,
1,3-bis(4'-azidobenzal)- 2-propanone-2'-sulfonic acid,
4,4'-diazidostilbene-2,2'-disulfonic acid,
sodium 4,4'-diazidostilbene-2,2'-disulfonate,
1,3-bis(4'-azido-2'-sulfobenzal)-2-propanone,
1,3-bis(4'-azido-2'-sodiumsulfonatobenzal)-2-propanone,
2,6-bis(4'-azido-2'-sulfobenzal)cyclohexanone,
2,6-bis(4'-azido-2'-sulfobenzal)methylcyclohexanone,
2,6-bis(4'-azido-2'-sodiumsulfonatobenzal)methylcyclohexanone, and
N,N'-diethyl-2,2'-disulfonamido-4,4'-diazidostilbene.

4. A color filter obtained by using a resin composition according to claim 1 or 2.

5. A color filter obtained by using a resin composition according to claim 3.

6. A resin composition according to claim 1, wherein said polymer dyeable with an anionic dye is a polymer prepared by polymerizing:
 a. a dyeable monomer;
 b. a hydrophilic monomer; and
 c. a hydrophobic monomer.

7. A resin according to claim 6, wherein the dyeable monomer is selected from the group consisting of (N,N-dimethylamino)ethyl acrylate, (N,N-dimethylamino)ethyl methacrylate, (N,N-diethylamino)ethyl acrylate, (N,N-diethylamino)ethyl methacrylate, (N,N-dimethylamino)propyl acrylamide, (N,N-dimethylamino)propyl methacrylamide, (N,N-dimethylamino)ethyl vinyl ether, (N,N-dimethylamino)propyl acrylate, (N,N-dimethylamino)propyl methacrylate, 4-vinylpyridine, 2-hydroxy-3-methacryloyloxypropyltrimethylammonium chloride, and methacryloyloxyethyltrimethylammonium chloride.

8. A resin composition according to claim 6, wherein the hydrophilic monomer is selected from the group consisting of hydroxyethyl acrylate, hydroxyethyl methacrylate, acrylamide, methacrylamide, vinylpyrolidone, dimethylaminoacrylamide, and methylaminoacrylamide.

9. A resin composition according to claim 6, wherein the hydrophobic monomer is selected from the group consisting of methyl acrylate, methyl methacrylate, ethyl acrylate, styrene, p-methylstyrene, butyl acrylate, butyl methacrylate, 2-ethylhexyl acrylate, and 2-ethylhexyl methacrylate.

* * * * *